US009217772B2

(12) United States Patent
Thong et al.

(10) Patent No.: US 9,217,772 B2
(45) Date of Patent: Dec. 22, 2015

(54) SYSTEMS AND METHODS FOR CHARACTERIZING DEVICES

(75) Inventors: Kar Meng Thong, Sin Ming (SG); Alvin L. Calma, San Fernando (PH)

(73) Assignee: Infineon Technologies AG, Neubiberg (DE)

( * ) Notice: Subject to any disclaimer, the term of this patent is extended or adjusted under 35 U.S.C. 154(b) by 4 days.

(21) Appl. No.: 13/562,485

(22) Filed: Jul. 31, 2012

(65) Prior Publication Data

US 2014/0040852 A1 Feb. 6, 2014

(51) Int. Cl.
| | |
|---|---|
| *G06F 17/50* | (2006.01) |
| *G11C 29/00* | (2006.01) |
| *G01R 31/28* | (2006.01) |
| *G01R 31/30* | (2006.01) |
| *G01R 31/3183* | (2006.01) |
| *G06F 11/263* | (2006.01) |
| *G06F 11/36* | (2006.01) |
| *G06F 11/26* | (2006.01) |
| *G01R 31/319* | (2006.01) |

(52) U.S. Cl.
CPC ........ *G01R 31/30* (2013.01); *G01R 31/318314* (2013.01); *G01R 31/31907* (2013.01); *G06F 11/261* (2013.01); *G06F 11/263* (2013.01); *G06F 11/362* (2013.01); *Y02T 10/82* (2013.01)

(58) Field of Classification Search
CPC ................. G01R 31/31907; G01R 31/318314; G06F 11/263; G06F 11/261; G06F 11/362
USPC .......... 716/102, 106, 111, 136, 139; 714/718, 714/726, 735, 738
See application file for complete search history.

(56) References Cited

U.S. PATENT DOCUMENTS

| | | | | |
|---|---|---|---|---|
| 4,379,259 | A * | 4/1983 | Varadi et al. | 714/45 |
| 4,656,632 | A * | 4/1987 | Jackson | 714/736 |
| 6,327,686 | B1 * | 12/2001 | Grundmann et al. | 714/738 |
| 6,378,092 | B1 | 4/2002 | Josephson | |
| 6,546,507 | B1 * | 4/2003 | Coyle et al. | 714/43 |
| 6,564,347 | B1 * | 5/2003 | Mates | 714/727 |
| 6,574,760 | B1 * | 6/2003 | Mydill | 714/724 |
| 6,832,182 | B1 * | 12/2004 | Wilson | 703/13 |
| 6,847,853 | B1 * | 1/2005 | Vinciarelli et al. | 700/97 |
| 7,017,094 | B2 * | 3/2006 | Correale et al. | 714/733 |
| 7,051,301 | B2 * | 5/2006 | Thompson et al. | 716/106 |
| 7,100,133 | B1 * | 8/2006 | Meiyappan et al. | 716/102 |
| 7,103,860 | B2 * | 9/2006 | Price et al. | 716/106 |
| 7,114,111 | B2 * | 9/2006 | Noy | 714/738 |
| 7,184,917 | B2 * | 2/2007 | Pramanick et al. | 702/120 |
| 7,197,417 | B2 * | 3/2007 | Pramanick et al. | 702/119 |
| 7,209,851 | B2 * | 4/2007 | Singh et al. | 702/119 |
| 7,225,372 | B2 * | 5/2007 | Suzuki et al. | 714/720 |
| 7,286,951 | B2 * | 10/2007 | Sutton | 702/117 |
| 7,366,951 | B2 * | 4/2008 | Fallah et al. | 714/33 |
| 7,400,995 | B2 * | 7/2008 | Mattes et al. | 702/118 |
| 7,467,364 | B2 * | 12/2008 | Hekmatpour | 716/106 |
| 7,506,286 | B2 * | 3/2009 | Beardslee et al. | 716/136 |

(Continued)

*Primary Examiner* — Helen Rossoshek
(74) *Attorney, Agent, or Firm* — Eschweiler & Associates, LLC

(57) ABSTRACT

A device characterization system includes a characterization tool and a test flow development generator. The characterization tool is configured to perform testing on a product device according to a test flow and generate test data. The characterization tool includes a list of available test instances that can be performed. The test flow development generator is configured to automatically generate the test flow according to device specifications for the product device and selected test instances of the list of available test instances.

17 Claims, 7 Drawing Sheets

(56) References Cited

U.S. PATENT DOCUMENTS

| | | | |
|---|---|---|---|
| 7,644,324 B2 * | 1/2010 | Arasawa | 714/718 |
| 7,647,219 B2 * | 1/2010 | Overturf et al. | 703/16 |
| 7,693,676 B1 * | 4/2010 | Keller et al. | 702/118 |
| 7,810,004 B2 * | 10/2010 | Mayer et al. | 714/734 |
| 7,836,416 B2 * | 11/2010 | Schubert et al. | 716/106 |
| 7,870,523 B1 * | 1/2011 | Uziel et al. | 716/106 |
| 7,979,759 B2 * | 7/2011 | Carnevale et al. | 714/718 |
| 7,996,742 B2 * | 8/2011 | Janke et al. | 714/735 |
| 8,099,271 B2 * | 1/2012 | Schubert et al. | 703/17 |
| 8,155,907 B1 * | 4/2012 | Lesea et al. | 702/79 |
| 8,185,788 B2 * | 5/2012 | Siebert | 714/726 |
| 8,255,198 B2 * | 8/2012 | Krishnaswamy et al. | 703/13 |
| 8,370,784 B2 * | 2/2013 | Padmanabhan et al. | 716/132 |
| 8,375,344 B1 * | 2/2013 | McGowan et al. | 716/117 |
| 8,381,051 B2 * | 2/2013 | Bahl et al. | 714/731 |
| 8,413,088 B1 * | 4/2013 | Armbruster et al. | 716/106 |
| 8,516,322 B1 * | 8/2013 | Ghosh Dastidar et al. | 714/738 |
| 8,650,020 B1 * | 2/2014 | Wu et al. | 703/15 |
| 8,661,397 B2 * | 2/2014 | La Fever et al. | 716/136 |
| 8,726,203 B1 * | 5/2014 | Uckun et al. | 716/100 |
| 2001/0010091 A1 * | 7/2001 | Noy | 716/4 |
| 2003/0093737 A1 * | 5/2003 | Purtell et al. | 714/738 |
| 2004/0183559 A1 * | 9/2004 | Ware et al. | 324/763 |
| 2004/0183578 A1 * | 9/2004 | Chong et al. | 327/161 |
| 2005/0154550 A1 * | 7/2005 | Singh et al. | 702/108 |
| 2006/0010348 A1 * | 1/2006 | Bylund et al. | 714/38 |
| 2006/0242503 A1 | 10/2006 | Masuda | |
| 2008/0016396 A1 * | 1/2008 | Higashi et al. | 714/30 |
| 2008/0115029 A1 * | 5/2008 | Kusko et al. | 714/742 |
| 2008/0262778 A1 * | 10/2008 | Katagiri et al. | 702/119 |
| 2009/0119542 A1 * | 5/2009 | Nagashima et al. | 714/33 |
| 2010/0023294 A1 * | 1/2010 | Fan et al. | 702/123 |
| 2010/0049495 A1 * | 2/2010 | Francken et al. | 703/14 |
| 2012/0229145 A1 * | 9/2012 | Kerber | 324/537 |
| 2012/0260129 A1 * | 10/2012 | Wilson et al. | 714/32 |
| 2013/0124932 A1 * | 5/2013 | Schuh et al. | 714/718 |
| 2014/0013294 A1 * | 1/2014 | Berkovitz et al. | 716/133 |
| 2014/0310693 A1 * | 10/2014 | Elston et al. | 717/129 |
| 2014/0324378 A1 * | 10/2014 | Elston et al. | 702/123 |

* cited by examiner

SYSTEMS AND METHODS FOR CHARACTERIZING DEVICES

BACKGROUND OF THE INVENTION

Circuits are integral components of modern devices ranging from cellular phones to automotive vehicles. Circuits are included in almost all devices. Circuits perform functions such as communications, control systems, and the like.

Circuit design is the process of designing circuits that can be utilized in devices. The process begins with identifying requirements or specifications for the circuit. The specifications can include voltage outputs, temperature range, operating environment, and the like. Once specifications are established, schematic diagrams are generated that meet the specifications. Simulations can then be performed to verify operation of the circuit design. Once verified, layouts and materials can be identified that are needed to implement the circuit design. Prototypes can then be built and tested for proper operation. A final design is then created from the preliminary layouts and circuit design. The final design includes methods of construction, materials, and the like. Further testing can be performed until final approval is obtained.

However, testing circuits can be time consuming and costly. The benefits obtained by testing can be outweighed by the costs of performing the testing.

DETAILED DESCRIPTION OF THE INVENTION

Figure 1:
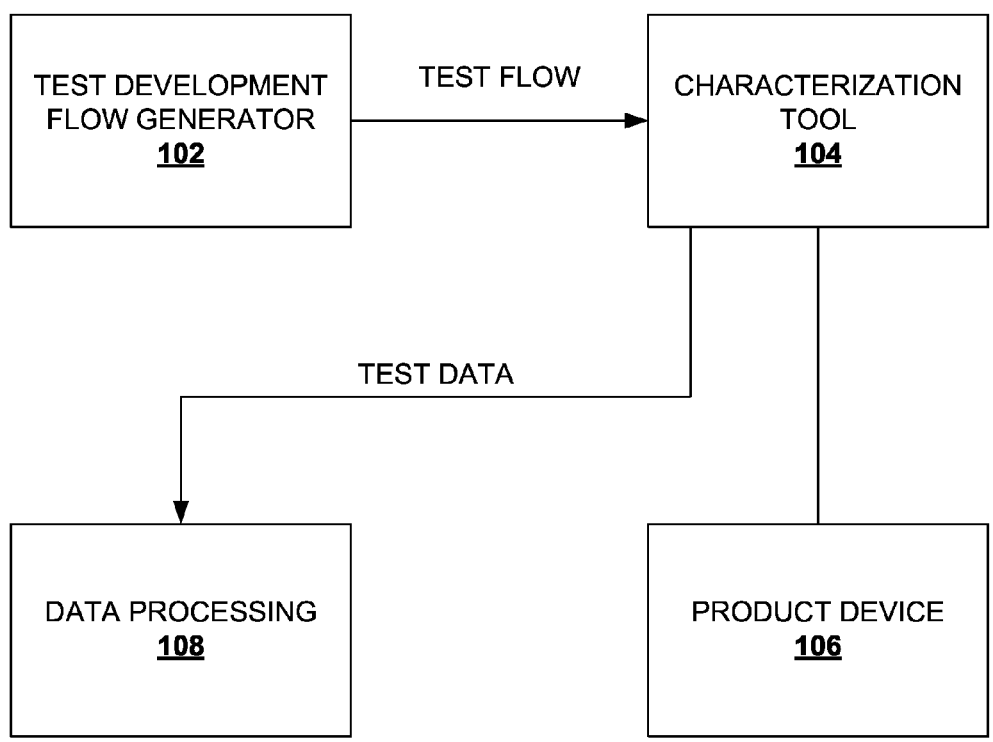
FIG. 1 is a block diagram illustrating an automatic test characterization system.

The present invention will now be described with reference to the attached drawing figures, wherein like reference numerals are used to refer to like elements throughout, and wherein the illustrated structures and devices are not necessarily drawn to scale.

The present invention includes embodiments that provide automatic characterization of integrated circuits. The embodiments include, for example, systems and methods for generating test flows and automatically testing integrated circuits and devices.

Circuits can encounter a variety of operating conditions during their lifetime. The operating conditions or characteristics can include voltage inputs, power inputs, voltage values, DC levels, AC values, frequencies, temperature and the like. It can be difficult to design devices for all possible scenarios.

FIG. 1 is a block diagram illustrating an automatic characterization test system 100 in accordance with an embodiment.

The system 100 automatically tests and processes test data for an integrated circuit without requiring interactive input throughout the testing.

The system 100 includes a test development flow generator 102, a characterization tool 104, a product device 106, and a data processing component 108. The product device 106 is an integrated circuit that has been fabricated according to specifications including design specifications and/or operating condition specifications. The specifications can include input signals, temperature conditions, power inputs, power variations, and the like. In one example, the product device 106 is an integrated circuit for automotive applications.

The characterization tool 104 is configured to selectively perform a variety of tests on integrated circuits. Here, the characterization tool 104 is configured to selective perform tests on the product device 106. The characterization tool 104 is configured to supply a variety of input signals and power signals, including but not limited to, Vdd, ground, bias voltages, varied frequencies, and the like. The characterization tool 104 is also configured to subject the product device 106 to a variety of conditions, such as temperatures, pressures, humidity levels, and the like.

The characterization tool 104 is configured to obtain test data by measuring nodes and/or connections on the product device 106. The measurements can include output signals, output power levels, temperatures, and the like. The test data can also include the applied input signals.

The characterization tool 104 includes probes and/or interconnects to provide the signals and obtain the measurements. These can include, for example, a socket to place an integrated circuit on.

The characterization tool 104 is controlled to perform the tests on the product device 106. The characterization tool 104 operates in response to a test flow, which specifies tests to perform and includes input values, power levels, timings, frequency values, and items to measure.

The data processing component 108 analyzes the test data and can automatically generate reports. The data processing component 108 can provide the test data in raw form for further analysis. Additionally, the data processing component 108 can generate graphs or plots, compare different test instances with each other, identify faults, and the like.

The test development flow generator 102 develops the test flow utilized by the characterization tool 104. The test development flow generator 102 receives several inputs including the specifications for the device 106, specific tests to perform (referred to as test instances), setups, and categories of testing. Based on the inputs, the test development flow generator 102 generates the test flow, which can encompass a wide variety and large number of test instances. This enables the wide variety and large number of test instances to be performed automatically without reconfiguring the characterization tool 104 in between. Further, user interaction is not required between tests.

In contrast, conventional mechanisms require a user to specify input values and timings for each particular test to be performed. Further, data from the varied tests is difficult to aggregate and analyze. As a result, circuit designers and developers may forego performing and/or analyzing tests and results due to the costs involved.

Figure 2:
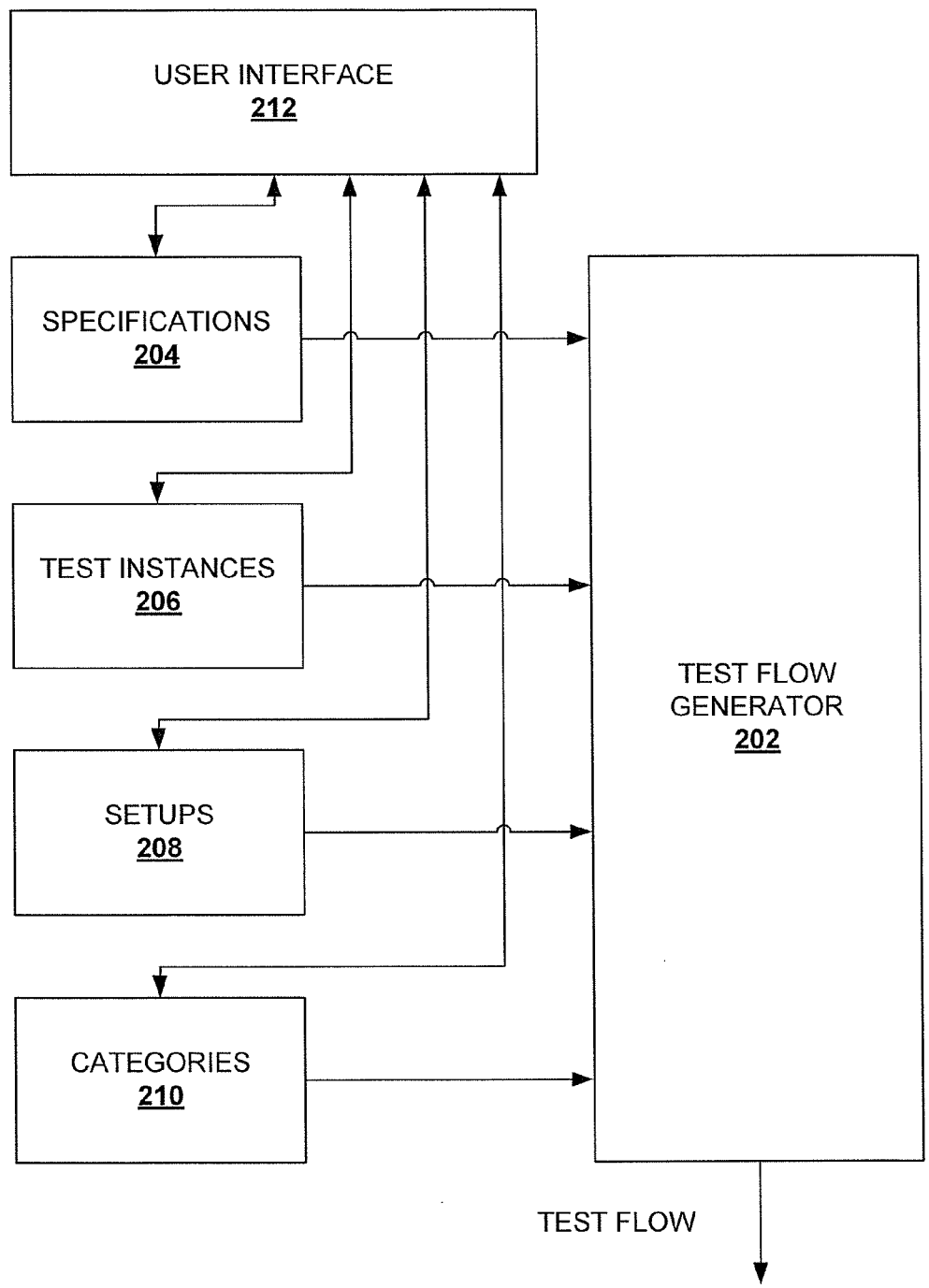
FIG. 2 is a block diagram illustrating a test flow generator system in accordance with an embodiment of the invention.

FIG. 2 is a block diagram illustrating a test flow generator system 200 in accordance with an embodiment of the invention. The system 200 generates a test flow that can be utilized by a characterization tool, such as described with regard to FIG. 1.

The system 200 includes a test flow generator 202, a user interface 212 and inputs or parameters including specifications 204, test instances 206, setups 208 and categories 210. The user interface 212 is configured to interactively obtain parameters for generating a test flow. The parameters include the specifications 204, the test instances 206, the setups 208 and the categories 210. The user interface 212 can include lists and permit selection of one or more items in the lists in order to obtain the parameters.

The specifications 204 include specification values, also referred to as parameters or parameter values, that can be varied. The values can include minimum, maximum values and step values. The step values specify or determine the number of values to be tested for a range of values. The values can specify DC or AC. Specification values can be removed if not needed. Variations in values can be specified as linear or non-linear and provided with a formula.

In one example, the specifications conform to ratings provided in a specification data sheet for a product device to be tested. In another example, the specifications exceed ratings provided in the specification data sheet for the product to be tested. This can be done to identify areas where the product device exceeds the specification data sheet.

The test instances 206 include a list of test instances available for the product device according to the specifications 204. In one example, the user interface 212 generates or provides a list of available test instances according to the specifications 204. The test instances 206 can include, for example, increasing a supply voltage Vdd from a minimum value to a maximum value according to a step value. In another example, the test instances 206 include increasing an input frequency from a minimum value to a maximum value according to a step value.

Then, one or more test instances from the list are selected and become the setups 208. The setups 208 include a list of selected test instances to be performed on the product device.

The setups 208 include a list of available setups according to the specifications 204 and the test instances 206. The available setups can include, for example, The categories 210 integrate the setups 208 with the test instances 206 according to categories. The categories 210 include a list of available categories. Selection of a category from the list alters available test instances 206.

The setups 208 and the specifications 204 are provided to the test flow generator 202 as parameters for characterization. The parameters are utilized by the test flow generator 202 to generate the test flow.

Figure 3A:
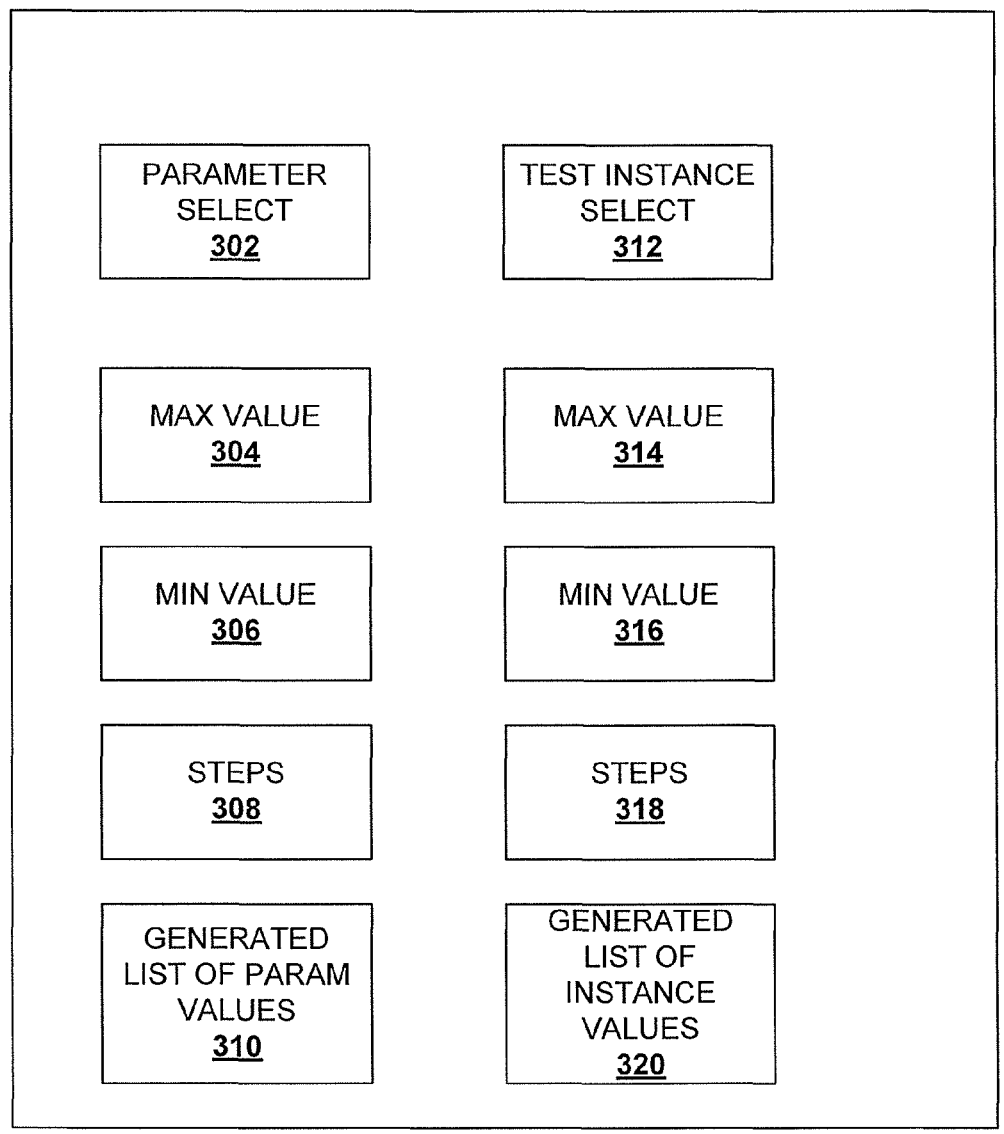
FIG. 3A is a block diagram illustrating a first portion of a user interface in accordance with an embodiment.

FIG. 3A is a block diagram illustrating a first portion 300 of a user interface in accordance with an embodiment. The user interface facilitates obtaining parameters that can be utilized to generate a test flow for testing a product device with a characterization tool. The user interface is provided as an example to facilitate understanding of the invention and this disclosure and can be utilized for component 212 of FIG. 2.

The first portion 300 includes a parameter select input 302, a max value input 304, a min value input 306, steps 308, and a generated list of parameter values 310. The parameter select input 302 permits a user to select a parameter for testing. In one example, the select input 302 is utilized to select a particular supply voltage (VDD33) for testing. The input 302 may display a list of available parameters. Additionally, the input 302 may also permit entering parameters.

The max value input 304 permits specifying a maximum value for the selected parameter. In one example, the max value is set at 1.7 volts. The min value input 306 permits specifying a minimum value for the selected parameter. In one example, the min value is set at 0.9 volts. The steps input 308 permits specifying a number of steps between the max value and the min value. In one example, the steps are set to 10. The specified steps are utilized to generate the list of parameter values 310. In one example, the generated list includes 0.9, 0.98, 1.06, 1.14, . . . 1.7. The generated list specifies values that will be tested by the characterization tool.

The first portion 300 also includes a test instance select input 312, a max value input 314, a min value input 316, steps 318, and a generated list of test instances 320. The select input 312 permits a user to select a test instance for testing. In one example, the input 312 is utilized to select a particular test instance for testing. The input 312 may display a list of available instances. Additionally, the input 312 may also permit entering parameters.

The max value input 314 permits specifying a maximum value for the selected test instance. In one example, the max value is set at 4.25. The min value input 316 permits specifying a minimum value for the selected parameter. In one example, the min value is set at 2.5. The steps input 318 permits specifying a number of steps between the max value and the min value. In one example, the steps are set to 10. The specified steps are utilized to generate the list of instance values 320. In one example, the generated list includes 2.5, 2.68, 2.85, 3.02, . . . 4.25. The generated list specifies values that will be tested by the characterization tool.

Figure 3B:
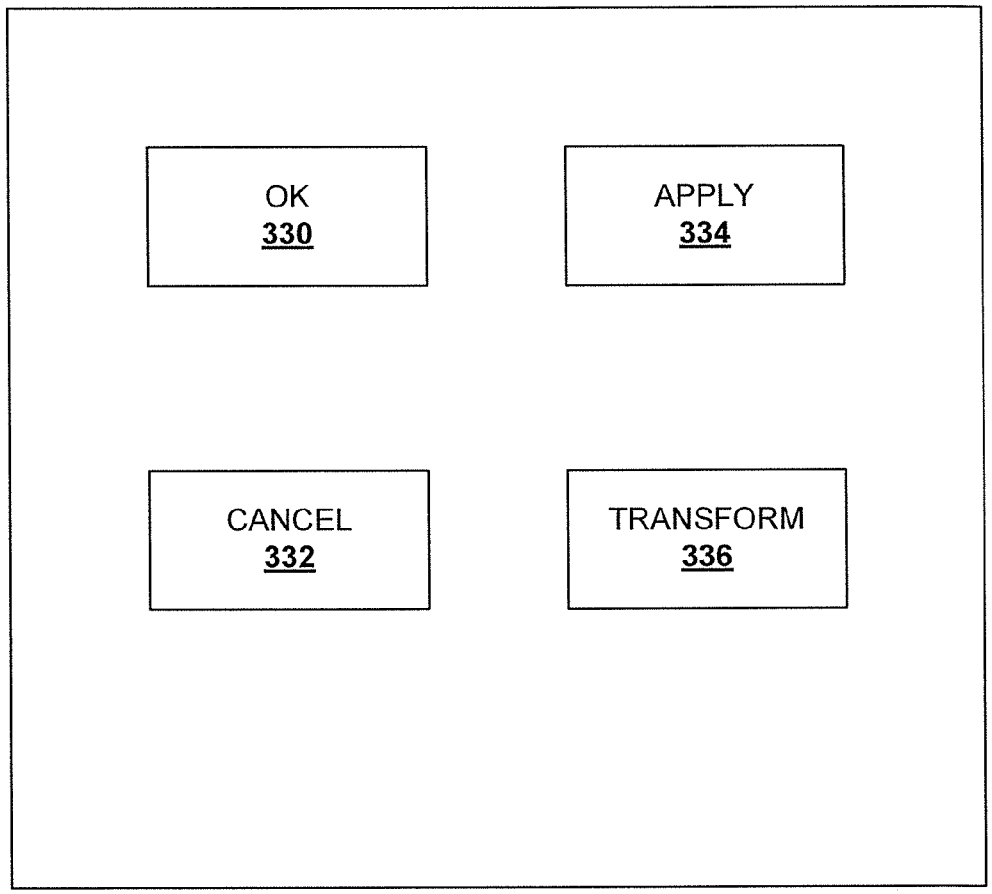
FIG. 3B is a block diagram illustrating a second portion of the user interface shown in FIG. 3A in accordance with an embodiment.

FIG. 3B is a block diagram illustrating a second portion 301 of the user interface shown in FIG. 3A in accordance with an embodiment. The user interface facilitates obtaining parameters that can be utilized to generate a test flow for testing a product device with a characterization tool. The user interface is provided as an example to facilitate understanding of the invention and this disclosure and can be utilized for component 212 of FIG. 2.

The portion 301 of the user interface includes an OK element 330, a cancel element 332, an apply element 334, and a transform element 336. These elements control generation of a test flow from the selected parameters and selected test instances.

The OK element 330 is activated to close the user interface, but saves any changes, for example, to the specifications 204, test instances 206, setups 208 and categories 210, collectively the parameters for the test flow. Then, if this particular test flow is opened again, the previous settings are maintained.

The cancel element 332 exits the user interface without saving any changes. Thus, if a user made selections and didn't like them, the user could activate the cancel element 332 to effectively erase them.

The apply element 334 is similar to the OK element 330, in that the apply element 334 saves changes when activated, however the apply element 334 keeps the user interface open.

The transform element 336 transforms the selections into a test flow, such as a robustness test, when activated. A test instance sheet is generated that includes the selected test instances and selected parameters and values. The test instance sheet upon completion of the transformation is utilized for the test flow for the product device to be characterized. Once complete, the characterization tool can be activated to perform the test flow.

Figure 4:
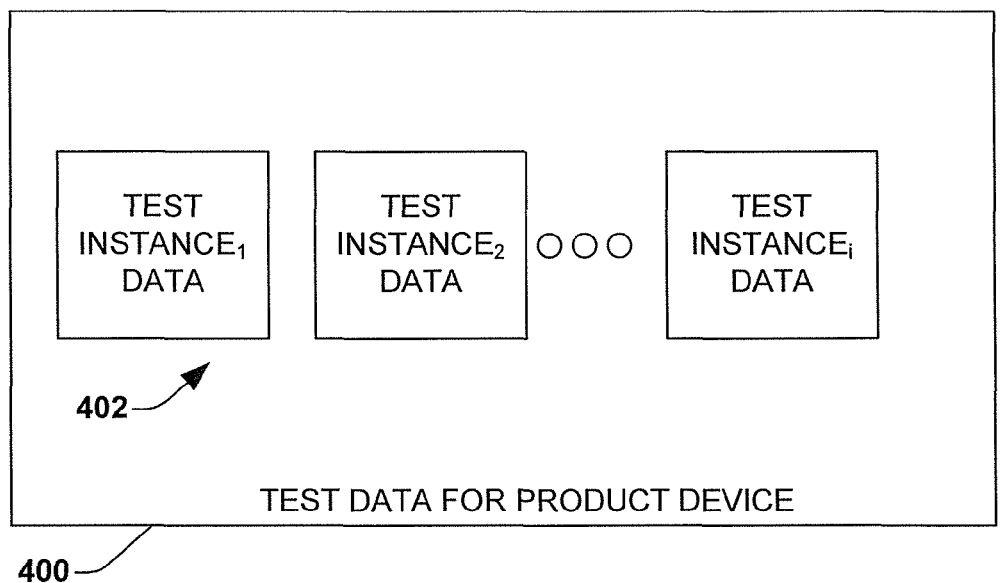
FIG. 4 is a block diagram illustrating a test data arrangement for a product device in accordance with an embodiment.

FIG. 4 is a block diagram illustrating a test data arrangement 400 for a product device in accordance with an embodiment. The arrangement 400 is provided as an example of a suitable arrangement in accordance with the invention.

The arrangement 400 is the output generated by a characterization tool performing tests in accordance with a test flow generated as described above. The test flow includes the selected test instances and parameters involved to test specifications for a product device. Thus, the arrangement 400 is specific to the product device.

In this example, the arrangement 400 includes a plurality of test instance data 402. Each includes test values particular to a selected test instance. The test values can include, for example, file name, a plot (shmoo plot), setup (shmoo setup), test name, pattern name, data, user, job name, test mode, temperature, horizontal axis specs, vertical axis specs, site number, device number, and/or the like.

In one example, the arrangement includes test values for three test instances, VDD13 vs VDD33 (2D), VDD13 vs tp (2D), and tp (1D)).

Figure 5:
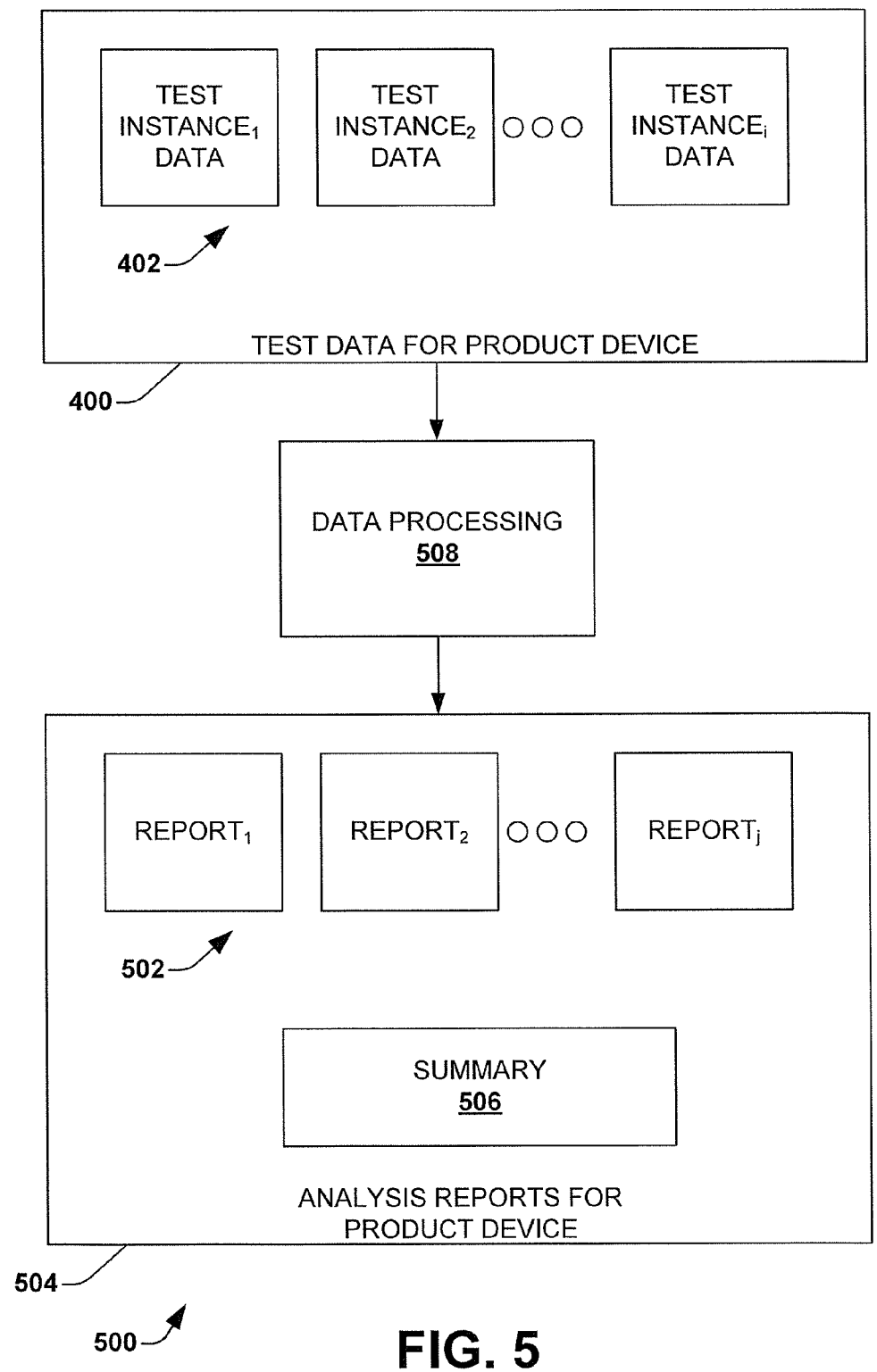
FIG. 5 is a block diagram illustrating a data processing system in accordance with an embodiment.

FIG. 5 is a block diagram illustrating a data processing system 500 in accordance with an embodiment. The system 500 processes and analyzes test data to facilitate analysis.

The system 500 includes a test data arrangement 400, a data processing component 508, and analysis reports 504 for a product device. The arrangement 400 is the output generated by a characterization tool performing tests in accordance with a test flow generated. The test flow includes the selected test instances and parameters involved to test specifications for the product device.

In this example, the arrangement 400 includes a plurality of test instance data 402. Each includes test values particular to a selected test instance. The test values can include, for example, file name, a plot (shmoo plot), setup (shmoo setup), test name, pattern name, data, user, job name, test mode, temperature, horizontal axis specs, vertical axis specs, site number, device number, and/or the like.

The data processing component 508 can be utilized in system 100 for the data processing component 108, described above. The data processing component 508 analyzes the test data and automatically generates analysis reports 504. The data processing component 508 can also provide the test data in raw form with the reports for further analysis. Additionally, the data processing component 508 can generate graphs or plots, compare different test instances with each other, identify faults, and the like.

The data processing component 508 includes a data cruncher in one example. The data cruncher, also referred to as a robustness data cruncher, facilitates viewing of test data. The data cruncher can be utilized to compare data from varied test instances and/or test data from multiple product devices.

The analysis reports component 504 include one or more individual reports 502. The individual reports 502 include tests data and/or analysis for one or more test instances. Thus, the individual reports 502 can compare and contrast data from multiple test instances.

The individual reports 502 can include raw data, graphs, plots, and the like. The individual reports 502 can also include pass/fail information by comparing test data with specifications for the product device.

The individual reports 502 can be generated automatically or in response to a user action, such as activation of a butt on a user interface. The type and content of the individual reports 502 can be selected to include or exclude information and/or analysis. Thus, in one example, the individual reports 502 are selected to provide only raw data. In another example, the individual reports 502 have additional content selected to provide graphs, pass/fail information, analysis, and the like.

The analysis reports component 504 also includes a summary 506. The summary 506 includes qualitative and/or quantitative information about the product device. The summary 506 can include graphs or plots and conveys an overall picture of the testing performed according to the test flow. The summary 506 can include information on whether the device meets or exceeds requires specifications for the product device. Additionally, the summary 506 can identify areas or aspects of the device that require modification in order to meet the specifications for the product device.

The summary 506 can be generated in response to a user action, such as activation of a button on a user interface, or can be generated automatically. In one example, the summary 506 includes a list of all test instances performed, parameters used, ranges of values for the parameters, test flow duration, values that passed, values that didn't pass, plots passed with margin, and the like.

The summary 506 can be provided to a user via a suitable mechanism. Thus, for example, the summary 506 can be printed, displayed on a screen, saved to a file, and the like. In one example, the summary 506 is saved in HTML format. In another example, the summary 506 is stored in XML formal.

In one example, a summary 506 includes test instances performed, plots analyzed, plots failing, plots or items with insufficient margin, plots with sufficient margin, duration of test, margin percentage or margin amount, values tested or input, ranges, and date of testing. The margin is a percentage or amount of margin required from threshold or limit values.

Figure 6:
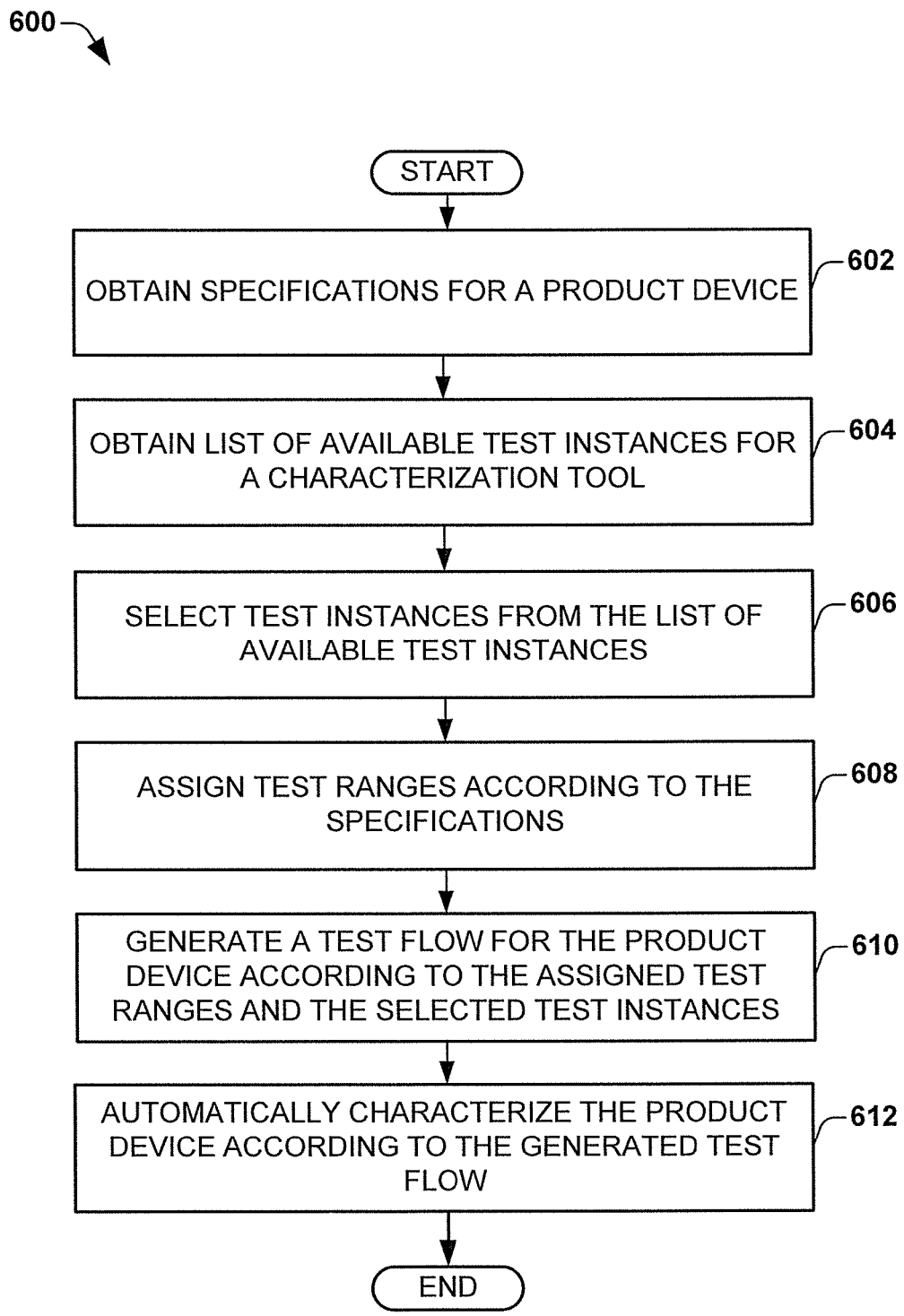
FIG. 6 is a flow diagram illustrating a method of performing characterization testing on a product device in accordance with an embodiment.

FIG. 6 is a flow diagram illustrating a method 600 of performing characterization testing on a product device in accordance with an embodiment. The method 600 can be utilized to identify characteristics of the product device, such as failure to comply with device or operational specifications.

The method 600 begins at block 602, wherein specifications for a product device are obtained. The specifications include designs and/or design specifications for which the product device was designed or fabricated. The specifications can include, for example, input signals, temperature conditions, power inputs, power variations, and the like. The product device is typically an integrated circuit. In one example, the integrated circuit is for automotive applications and is required by its specifications to operate in a relatively wide variety of temperature conditions, power inputs, power variations, and the like.

A list of test instances for a characterization tool is obtained at block 604. The list of test instances includes tests, such as power, frequency, and temperature tests, that the characterization tool is capable of performing. In one example, the list is limited to only those tests applicable to the product device. In one example, one of the test instances is an output as a variation of frequency and a supply voltage.

Test instances from the list of available test instances are selected at block 606 according to the specifications. The selected test instances represent or include test instances that measure or determine whether the product device meets the specifications. The selected test instances are typically a subset of the list of available test instances.

The selected test instances can be obtained in a variety of suitable ways. Selectable setups according to devices can be available to guide the selections. For example, one or more setups particular to automotive integrated circuits can identify or pre-select a portion of the available test instances.

Test ranges or values are assigned to the test instances according to the specifications at block 608. The test ranges can include max values, min values, and step values for variable parameters and test conditions. The test ranges are typically set according to the specifications so as to determine whether the product device meets or exceeds the specifications.

A test flow is generated at block 610 according to the assigned test ranges and the selected test instances. The test flow is generated by combining the test instances in a suitable order, including repeating selected test instances with varied test ranges.

The product device is automatically characterized at block 612 according to the generated test flow. A characterization tool, such as described above, is utilized to automatically characterize the product device by performing the tests. The characterization tool obtains test data, which includes measurements and the like for each of the test instances.

The test data can be analyzed and/or aggregated to generate reports and the like regarding the characterization. In one example, the test data is compared with the specifications to determine whether the product device meets the specifications.

While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the circuits or systems shown in FIGS. 1-5, etc., are non-limiting examples of circuits or devices that may be used to implement method 600, and variations thereof).

One embodiment relates to a device characterization system. The device characterization system includes a characterization tool and a test flow development generator. The characterization tool is configured to perform testing on a product device according to a test flow and generate test data. The characterization tool includes a list of available test instances that can be performed. The test flow development generator is configured to automatically generate the test flow according to device specifications for the product device and selected test instances of the list of available test instances.

Another embodiment relates to a test flow generation system. The system includes a specifications component, a test instances component, a test setups component, and a categories component. The specifications component is configured to have a list of parameter values that can be varied. The test instances component is configured to have a list of test instances available for a product device. The test setups component is configured to have a list of available setups according to the list of test instances and the specifications values. The categories component is configured to have a list of selectable categories derived from the setups and the test instances. The user interface is configured to generate selected test instances from the list of available test instances and selected parameters. The test flow generator s configured to provide a test flow according to the selected test instances and the selected parameters.

Yet another embodiment includes a method of characterizing a device, such as an integrated circuit. Specifications are obtained for a product device. The specifications can include design specifications and/or operating requirement specifications. A list of available test instances are obtained for a characterization tool. Test instances are selected from the list of available test instances according to the specifications for the product device. Test ranges are assigned for the test instances according to the specifications. A test flow is generated according to the assigned test ranges and the selected test instances. The product device is characterized by the characterization tool according to the generated test flow.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A device characterization system comprising:
   a characterization tool configured to perform testing on a product device according to a test flow and to generate test data, wherein the characterization tool includes a list of available test instances, wherein the list of available test instances are specific tests performable by the characterization tool and is altered by a selected category, wherein the characterization tool is an apparatus;
   a test flow development generator configured to generate the test flow according to device specifications for the product device and selected test instances of the list of available test instances and to identify the selected test instances as only those tests applicable to the product device based on the device specifications:
   wherein the characterization tool includes an interface configured to identify the selected category from a plurality of categories and identify the selected test instances from a modified list of available test instances, wherein the modified list of available test instances is altered from the list of available test instances according to the selected category; and
   a data processing component configured to generate an analysis report based on the generated test data from the characterization tool and other product device data, wherein the analysis report identifies whether the product device meets the device specification.

2. The system of claim 1, further comprising a data processing component configured to receive the test data.

3. The system of claim 2, wherein the data processing component is configured to generate reports from the test data.

4. The system of claim 2, wherein the data processing component is configured to selectively analyze the test data.

5. The system of claim 4, wherein the data processing component is configured to generate a summary report that includes pass/fail information for the product device.

6. The system of claim 1, wherein the product device is an integrated circuit utilized for automotive applications.

7. The system of claim 1, wherein the selected test instances include test ranges that specify one or more properties of the product device to be tested and a range of input values.

8. The system of claim 1, wherein the list of available test instances includes test instances that specify temperature conditions.

9. The system of claim 1, wherein at least one of the list of available test instances tests supply voltage variations.

10. The system of claim 1, wherein the characterization tool is configured to supply a plurality of input signals including power signals according to the test flow.

11. The system of claim 1, wherein the characterization tool is configured to subject the product device to environmental conditions including temperature and pressure according to the test flow.

12. The system of claim 1, wherein the characterization tool is configured to obtain at least a portion of the test data by measuring nodes and connections on the product device.

13. The system of claim 1, wherein the test flow development generator is configured to receive specifications, test instances, setups, and categories.

14. The system of claim 1, wherein the test flow development generator is configured to combine the selected test instances to generate the test flow.

15. A method of characterizing a device, the method comprising:

obtaining specifications for a product device;

obtaining a list of test instances performable by a characterization tool, using a test flow generator apparatus, wherein obtaining the list of test instances includes selecting parameters and generating instance values for the list of test instances;

selecting a category from a plurality of categories and altering the list of test instances according to the selected category;

selecting test instances of the list of test instances applicable to the product device according to the specifications for the product device;

assigning test ranges for the selected test instances according to the specifications; and generating a test flow according to the assigned test ranges and the selected test instances; and generating test data for the product device according to the generated test flow and generating an analysis report based on the generated test data, wherein the analysis report identifies whether the product device meets the device specification.

16. The method of claim 15, further comprising automatically characterizing the product device according to the test flow.

17. The method of claim 15, wherein selecting the test instances comprises selecting setups of testing.

* * * * *